(12) United States Patent
Hirose et al.

(10) Patent No.: US 10,073,153 B2
(45) Date of Patent: Sep. 11, 2018

(54) DEVICE FOR ATTACHING AND DETACHING NMR PROBE

(71) Applicant: JEOL Ltd., Tokyo (JP)

(72) Inventors: Masanori Hirose, Tokyo (JP); Yoshiaki Yamakoshi, Tokyo (JP); Masahide Nishiyama, Tokyo (JP); Shinji Nakamura, Tokyo (JP); Katsuyuki Toshima, Tokyo (JP); Fumio Hobo, Tokyo (JP); Terumasa Okada, Tokyo (JP); Shigenori Tsuji, Tokyo (JP); Ryoji Tanaka, Tokyo (JP); Hiroto Suematsu, Tokyo (JP)

(73) Assignee: JEOL Ltd., Tokyo (JP)

( * ) Notice: Subject to any disclaimer, the term of this patent is extended or adjusted under 35 U.S.C. 154(b) by 968 days.

(21) Appl. No.: 14/546,359

(22) Filed: Nov. 18, 2014

(65) Prior Publication Data
US 2015/0168518 A1 Jun. 18, 2015

(30) Foreign Application Priority Data
Nov. 18, 2013 (JP) .................................. 2013-237871

(51) Int. Cl.
*G01V 3/00* (2006.01)
*G01R 33/34* (2006.01)
*G01R 33/30* (2006.01)

(52) U.S. Cl.
CPC ..... *G01R 33/34007* (2013.01); *G01R 33/307* (2013.01); *G01R 33/34015* (2013.01); *G01R 33/34092* (2013.01)

(58) Field of Classification Search
CPC .................................................. G01R 33/307
USPC .................................................. 324/321, 318
See application file for complete search history.

(56) References Cited

U.S. PATENT DOCUMENTS

| | | | | |
|---|---|---|---|---|
| 6,768,305 B1* | 7/2004 | Keifer | ..................... | G01R 33/31 324/315 |
| 6,859,036 B2* | 2/2005 | Aihara | .............. | G01R 33/34046 324/319 |
| 7,222,490 B2 | 5/2007 | Triebe et al. | | |
| 7,501,822 B2 | 3/2009 | Sacher et al. | | |
| 8,217,655 B2* | 7/2012 | De Vries | ............... | G01R 33/307 324/321 |
| 2012/0242335 A1* | 9/2012 | Schett | ................ | G01R 33/3403 324/318 |

(Continued)

*Primary Examiner* — Louis Arana
(74) *Attorney, Agent, or Firm* — The Webb Law Firm

(57) ABSTRACT

A device for attaching and detaching a cryogenic probe to and from a nuclear magnetic resonance (NMR) spectrometer. The device permits the probe to be loaded in the spectrometer in a shortened time and achieves high measurement throughput. The device has loading platforms (11-1, 11-2) on which cryogenic probes (P1, P2) are loaded. Each loading platform has a horizontal drive mechanism, a vertical drive mechanism, and a spacing mechanism. The device further includes probe cooling devices (14-1, 14-2) for circulating a refrigerant to and from the cryogenic probes (P1, P2) via transfer tubes (12-1, 12-2) made of a flexible material, thus cooling the probes (P1, P2). A temperature-controlled gas feeder (18) supplies a temperature variable gas for temperature adjustment to the probes (P1, P2). A vacuum pumping system (15) evacuates the interiors of the probes (P1, P2) via vacuum pipes (17-1, 17-2) made of a flexible material.

6 Claims, 7 Drawing Sheets

(56) References Cited

U.S. PATENT DOCUMENTS

2014/0084928 A1\* 3/2014 Gisler ................... G01R 33/31
　　　　　　　　　　　　　　　　　　　　　324/321

\* cited by examiner

DEVICE FOR ATTACHING AND DETACHING NMR PROBE

BACKGROUND OF THE INVENTION

1. Field of the Invention

The present invention relates to a nuclear magnetic resonance (NMR) spectrometer equipped with an NMR probe operating at cryogenic temperatures and, more particularly, to a device for attaching and detaching an NMR probe to and from an NMR spectrometer.

2. Description of Related Art

An NMR spectrometer is an instrument for analyzing the molecular structure of a sample by placing the sample to be investigated in a strong static magnetic field, applying RF electromagnetic waves to the sample to induce nuclear magnetic resonance, detecting an electrical signal (i.e., an NMR signal) induced as electric power in a detection coil by nuclear spins starting to precess, and obtaining an NMR spectrum.

A probe used in an NMR spectrometer has the detection coil inside it. The probe is replaceably mounted in a magnet generating a static magnetic field such that the detection coil is placed within the static magnetic field. RF electromagnetic waves are applied to the sample by the detection coil. Also, an NMR signal emanating from the sample is detected by the detection coil. One type of probe developed recently has a detection module having a detection coil and a preamplifier which are cooled by a refrigerant in order that NMR signals can be detected with higher sensitivity.

This type of probe capable of detecting NMR signals with high sensitivity by cooling the detection module is referred to as a "cryogenic probe" and to be discriminated from ordinary probes involving no cooling.

It is preferable for NMR apparatus users to be able to select and use a desired probe such that optimum signal detection is possible depending on the properties of a sample and on information to be obtained.

For example, where the amount of the sample is small, it is desirable to select a probe having a detection coil whose detection sensitivity is optimized for a small-volume sample tube. On the other hand, with respect to a sample available in a sufficient amount, it is preferable to select a probe permitting use of a large-volume sample tube, for the following reason. Generally, detection sensitivity increases in proportion to the ratio of the volume of the sample to the volume of the coil, i.e., in proportion to the square root of a so-called filling factor, and increases in proportion to the square root of the volume of the sample.

For example, if one wants to know the bonding between a carbon site and surrounding hydrogen atoms to get a clue to the composition of a sample, it is preferable to select a probe specifically designed for observation of $^{13}C$ nuclear spins under irradiation of $^{1}H$ nuclear spins. On the other hand, if one wants to investigate nitrogen sites and phosphorus sites in addition to carbon sites, it is desirable to select a probe having capabilities of making observations over a wide range permitting multinuclear NMR spectroscopy under irradiation of $^{1}H$ nuclear spins.

In this way, if an optimum probe is selected according to the properties of a sample and information to be obtained and is used, then high-sensitivity measurements are possible. The time taken to obtain a spectrum having a desired signal to noise ratio by performing accumulations and averaging is reduced. Consequently, high measurement throughput can be accomplished.

Even where the measurement time is shortened by the use of such an optimum probe, if the time taken to exchange the current probe by an optimum probe and to make preparations for a measurement is long, then the total time required for the measurement is long. This will become a factor deteriorating the throughput.

In the case of an ordinary probe having no cooling means, the time taken to exchange the current probe is sufficiently short compared with the measurement time. Furthermore, a measurement can be started immediately after the end of the exchange work. Therefore, no great problems take place. However, in the case of a cryogenic probe, it takes longer to replace it than in the case of an ordinary probe. In addition, cooling and vacuum pumping sequence are required from the exchange to the time when the equipment is made usable. Therefore, it takes a long time to exchange the cryogenic probe. Consequently, it is inevitable that the total time taken to perform a measurement including the probe exchange time will be prolonged.

SUMMARY OF THE INVENTION

In view of the foregoing circumstances, the present invention has been made. It is an object of the present invention to provide a device which can attach and detach a cryogenic probe such that the probe can be made usable in a short time.

A device according to one embodiment of the present invention is adapted to attach and detach at least one NMR probe to and from a probe insertion portion of a nuclear magnetic resonance (NMR) spectrometer, the NMR probe having a detection module for detecting an electrical signal induced by nuclear magnetic resonance of a sample and a cooling portion for cooling the detection module by a refrigerant. The device for attaching and detaching an NMR probe or probes further includes: at least one loading platform for carrying the probe therein, the loading platform having a horizontal drive mechanism for moving the carried probe in a horizontal direction to bring the probe into an exchange position located opposite to the probe insertion portion and into a standby position remote from the probe insertion portion, a vertical drive mechanism for moving the probe in a vertical direction, and a spacing mechanism for spacing the loading platform away from the probe when the probe is loaded in the NMR spectrometer; a probe cooling device for cooling the probe by supplying the refrigerant into the cooling portion of the probe; transfer tubes made of a flexible material and each including a refrigerant supply line for supplying the refrigerant from the probe cooling device into the probe and a refrigerant discharge line for causing the refrigerant discharged from the probe to be returned to the probe cooling device; a vacuum pumping system for evacuating the interior of the probe; and vacuum pipes made of a flexible material and connecting together the vacuum pumping system and the probes.

According to the present invention, an optimum cryogenic probe can be loaded in a short time according to the properties of a sample and information to be obtained and, therefore, high-sensitivity measurements are possible. Furthermore, high measurement throughput can be achieved.

DESCRIPTION OF THE INVENTION

Figure 1:
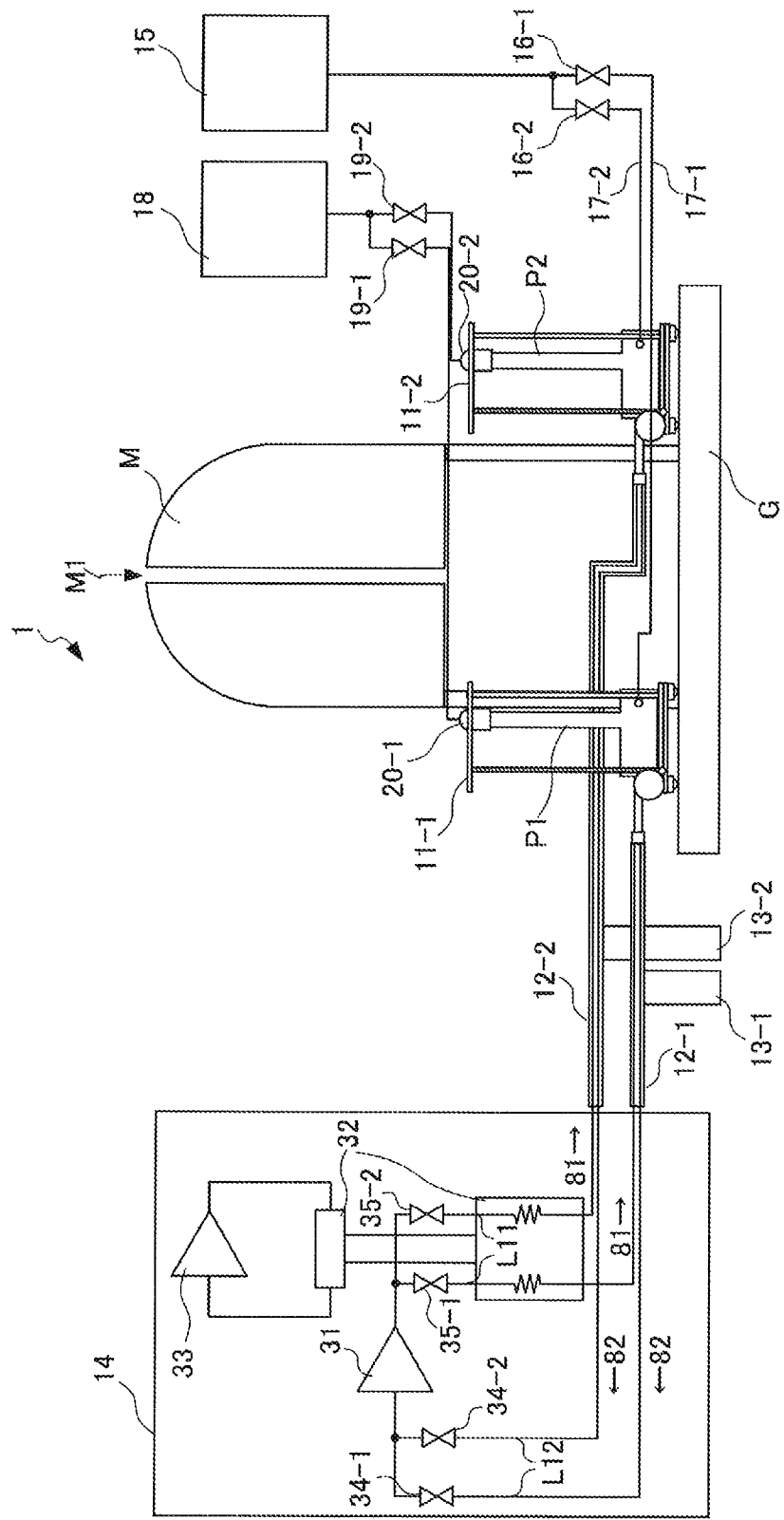
FIG. 1 is a side elevation, partly in block form, of an NMR spectrometer including a probe attaching and detaching device associated with the present invention.

An NMR spectrometer according to one embodiment of the present invention is hereinafter described, the spectrometer including a probe attaching and detaching device associated with the present invention. FIG. 1 shows the whole configuration of the NMR spectrometer.

As shown in FIG. 1, the NMR spectrometer according to the present embodiment is generally indicated by reference numeral 1 and has a superconductive magnet unit M, cryogenic probes P1, P2, and the device for attaching and detaching a probe.

The device for attaching and detaching a probe has loading platforms 11-1, 11-2, transfer, tubes 12-1, 12-2, support bases 13-1, 13-2, a probe cooling device 14, a vacuum pumping system 15, open-close valves 16-1, 16-2, vacuum pipes 17-1, 17-2, a temperature-controlled gas feeder 18, open-close valves 19-1, 19-2, and temperature-controlled gas feeder caps 20-1, 20-2.

The superconductive magnet unit M is a device for producing a strong static magnetic field in one direction, and is installed on a floor G. A main coil (not shown) formed by winding superconducting wire is disposed inside the superconductive magnet unit M. The main coil is cryogenically cooled by liquid nitrogen, liquid helium, or the like.

The superconductive magnet unit M is provided with a cylindrical bore M1 in which the cryogenic probe P-1 or P-2 can be loaded. The bore M1 is formed along the central axis of the superconductive magnet unit M. The cryogenic probe P-1 or P-2 (described later) is upwardly inserted into the bore M1 from its lower opening.

The cryogenic probes P1 and P2 are devices for detecting feeble electrical signals produced when the sample induces nuclear magnetic resonance. In the present embodiment, the two cryogenic probes P1 and P2 are prepared. Samples are loaded in the probes, respectively. Consequently, the user of the NMR spectrometer 1 can select an optimum cryogenic probe from the two probes according to the properties of the sample and information to be obtained.

To facilitate understanding the present invention, the two cryogenic probes P1 and P2 are prepared in the present embodiment. There may be three or more cryogenic probes as described later. Where it is not necessary to discriminate between the two cryogenic probes P1 and P2 below, these are referred to as cryogenic probes P.

Figure 2:
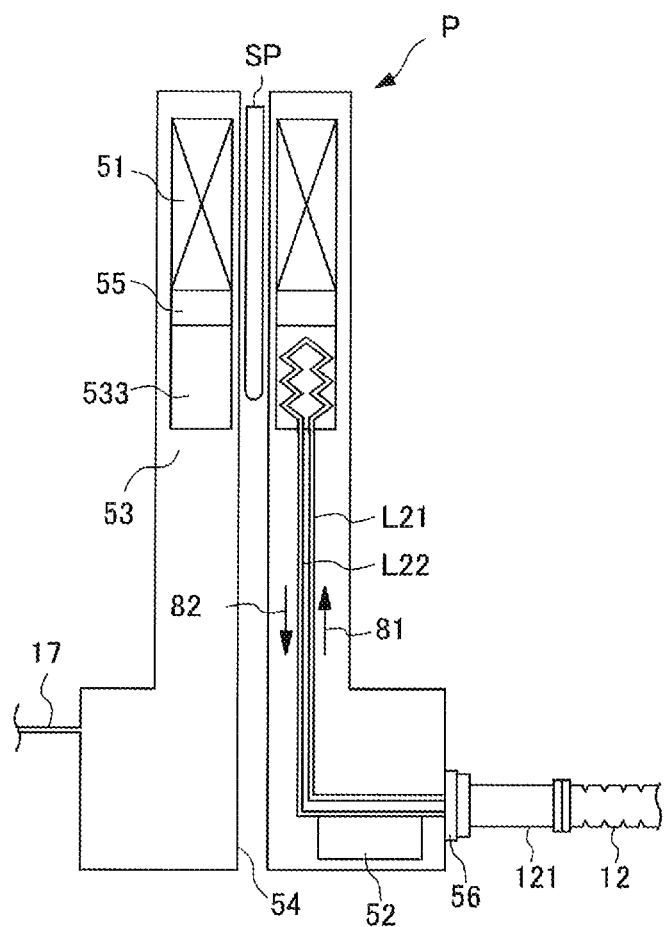
FIG. 2 is a schematic vertical cross section of a cryogenic probe shown in FIG. 1.

FIG. 2 is a schematic view showing the configuration of one cryogenic probe P shown in FIG. 1. Various parts of the probe P are shown schematically in terms of shape and arrangement in FIG. 2.

Each cryogenic probe P has a detection coil 51, a preamplifier 52, a cooling portion 53, a shielding pipe 54, a heat link 55, and a probe-side joint 56. Furthermore, the cryogenic probe P includes a refrigerant supply line L21 and a refrigerant discharge line L22.

The cryogenic probe P is a hollow container shaped substantially in the form of a circular cylinder. The interior of the probe P is maintained at vacuum by the vacuum pumping system 15 (described later). The shielding pipe 54 that is a cylindrical member extending from the upper end to the lower end of the probe P is disposed in the center of the probe. A sample SP to be investigated is inserted into the shielding pipe 54 from the upper end side, the pipe 54 providing thermal insulation between the sample SP and the detection coil 51 at low temperatures. The temperature-controlled gas feeder cap 20-1 or 20-2 (described later) is fitted over the upper or lower side of the shielding pipe 54. A temperature-controlled gas is supplied from the temperature-controlled gas feeder 18 (described later).

The detection coil 51 applies RF electromagnetic waves to the sample SP when the sample is inserted in the shielding pipe 54 of the cryogenic probe P. The coil 51 is connected with an RF oscillator (not shown). The coil 51 generates RF electromagnetic waves, shaped in the form of pulses, in response to an RF signal supplied from the RF oscillator. The application of the RF electromagnetic waves induces magnetic resonance in nuclear spins of interest contained in the sample SP, resulting in an NMR signal. This NMR signal is detected by the detection coil 51 and fed to the preamplifier 52.

The preamplifier 52 is an electrical circuit for amplifying the NMR signal detected by the detection coil 51. The amplified NMR signal is sent to an external analyzing apparatus (not shown). The preamplifier 52 is in thermal contact with the refrigerant discharge line L22 (described later).

In this way, in the present embodiment, the detection coil 51 and the preamplifier 52 together constitute an NMR detection module.

The cooling portion 53 operates to cool the detection coil 51 and has a heat exchanger 533. This heat exchanger 533 is so positioned that it makes thermal contact with the detection coil 51 via the intervening the heat link 55 having a tuning circuit (not shown).

In the cooling portion 53, the heat exchanger 533 cools the detection coil 51 in thermal contact with the cooling portion 53 via the heat link 55 by depriving heat as sensible heat or latent heat of the refrigerant from the heat link 55, the refrigerant flowing through the heat exchanger 533.

The refrigerant supply line L21 and the refrigerant discharge line L22 are connected with the heat exchanger 533. The supply line L21 is a pipe used such that outward streams of refrigerant 81 supplied from the probe cooling device 14 (described later) is fed into the heat exchanger 533. The upstream end of the refrigerant supply line L21 is connected with the probe-side joint 56 (described later). The downstream end of the refrigerant supply line L21 is connected with the heat exchanger 533.

The refrigerant discharge line L22 is a pipe used to discharge the refrigerant from the heat exchanger 533 into the probe cooling device 14 (described later). The upstream end of the discharge line L22 is connected with the heat exchanger 533. The downstream end of the discharge line L22 is connected with the probe-side joint 56 (described later).

The refrigerant discharge line L22 is in thermal contact at its intermediate point with the preamplifier 52 mounted in the cryogenic probe P. Lower-temperature, returning streams of refrigerant 82 passing through the refrigerant discharge line L22 make thermal contact with the preamplifier 52 via the refrigerant discharge line L22. Consequently, the preamplifier 52 is cooled.

The probe-side joint 56 is a part for connecting the refrigerant supply line L21 and the refrigerant discharge line L22 with external refrigerant supply lines L11 and external refrigerant discharge lines L12 (FIG. 1), respectively. Ferrules (not shown) fitted to ends of the refrigerant supply line L21 and refrigerant discharge line L22 are attached to the probe-side joint 56. The probe-side joint 56 is connectable with a probe coupler 121 of the transfer tube 12-1 or 12-2 (described later). Only the part of the probe coupler 121 connected with the probe-side joint 56 is shown in FIG. 2. In FIG. 2, the transfer tube 12 (FIG. 1) is not totally shown.

The refrigerant supply lines L11 (FIG. 1) on the side of the probe cooling device 14 (described later) and the refrigerant supply line L21 on the side of the cryogenic probe P are connected together and the refrigerant discharge lines L12 on the side of the probe cooling device 14 (described later) and the refrigerant discharge line L22 on the side of the probe P are connected together by coupling together the probe-side joint 56 and the probe coupler 121.

Referring back to FIG. 1, the two cryogenic probes P1 and P2 of the construction described so far are loaded in the loading platforms 11-1 and 11-2, respectively. The probes are connected with the probe cooling device 14 by the transfer tubes 12-1 and 12-2, respectively. The probes are connected with the vacuum pumping system 15 by the vacuum pipes 17-1 and 17-2, respectively.

The loading platforms 11-1 and 11-2 are mechanisms which can freely move on the floor G substantially horizontally while carrying the cryogenic probes P1 and P2, respectively, therein. Also, the loading platforms can elevate and lower the probes P1 and P2, respectively.

In particular, in a standby mode, the loading platforms 11-1 and 11-2 place the two cryogenic probes P1 and P2 in their respective preset positions (hereinafter referred to as standby positions) shown in FIG. 1. In an exchange mode, the loading platforms move and place the probes into positions (hereinafter referred to as the exchange positions) located immediately under the bore M1 in the superconductive magnet unit M.

Figure 3:
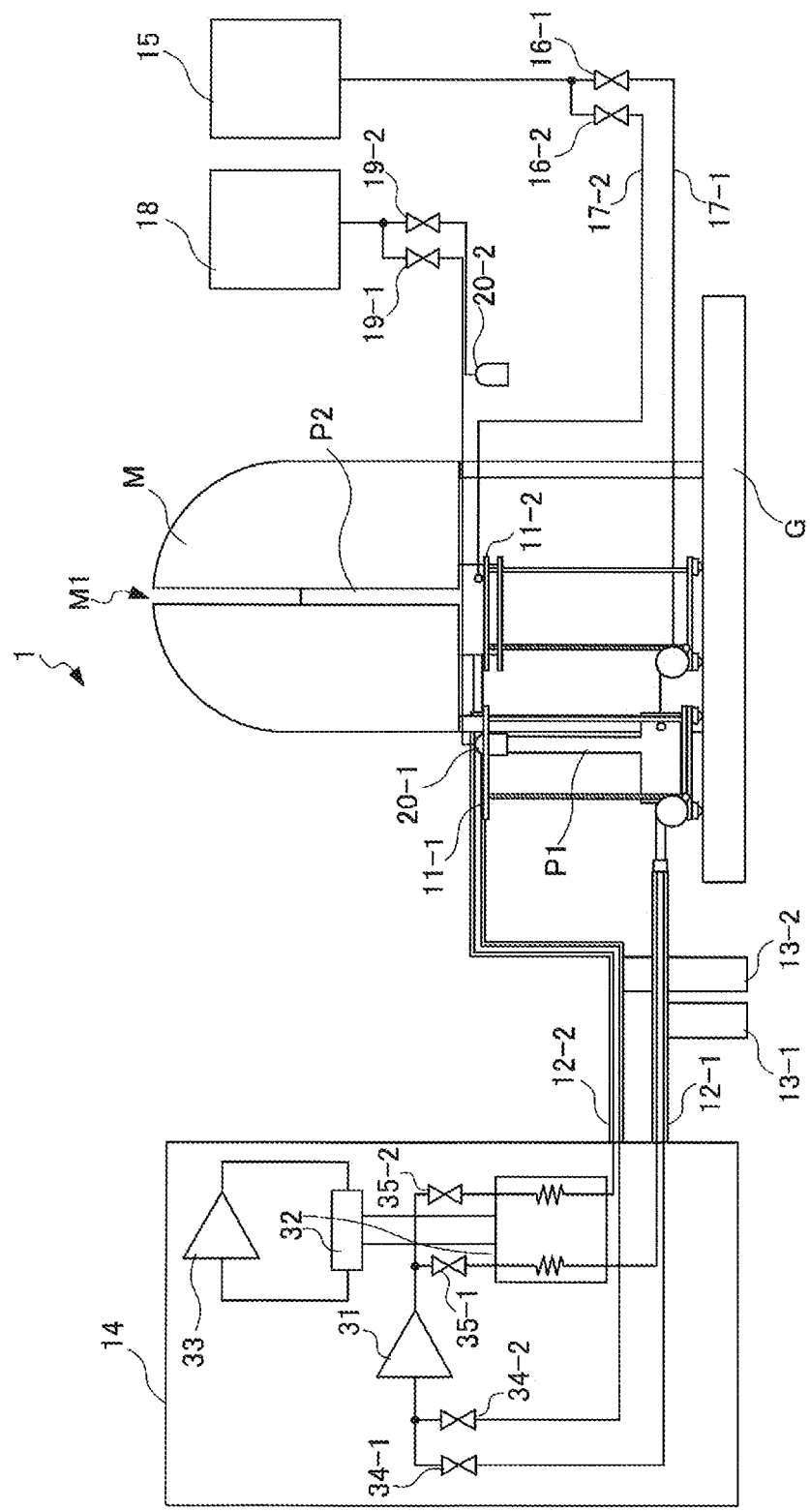
FIG. 3 is a block diagram similar to FIG. 1, but showing a different state.

FIG. 3 shows the whole configuration of the NMR spectrometer including the probe attaching and detaching device associated with the present invention, depicting a state different from the state shown in FIG. 1. That is, one cryogenic probe P1 is on standby, while the other probe P2 is in an attachment mode in which the probe P2 is loaded.

In the example of FIG. 3, after the cryogenic probe P2 has shifted from the standby mode to the exchange mode, the loading platform 11-2 elevates the probe P2 to upwardly insert it into the bore M1 of the superconductive magnet unit M from its lower opening. As a result, the probe P2 is loaded in the bore M1 of the magnet unit M as shown in FIG. 3. The probe P2 shifts into the attachment mode. The position of each cryogenic probe P (the position of the cryogenic probe P2 in the example of FIG. 3) in the attachment mode is hereinafter referred to as the attachment position.

Where the probe is subsequently replaced by the cryogenic probe P1 in an unillustrated manner, the probe P2 shifts from the attachment mode to the exchange mode. The loading platform 11-2 lowers the probe P2 into its exchange position in order to downwardly remove the probe P2 from the lower opening of the bore M1 in the superconductive magnet unit M. Then, the loading platform 11-2 moves the probe P2 substantially horizontally on the floor G from its exchange position into its standby position shown in FIG. 1. Consequently, the probe P2 shifts from the exchange mode to the standby mode.

Briefly, the loading platform 11-1 moves the cryogenic probe P1 substantially horizontally and elevates or lowers the probe P1 according to the state of the probe P1 in the same way as the loading platform 11-2.

Since these loading platforms 11-1 and 11-2 are mounted, during the process in which the cryogenic probes P1 and P2 go from their standby mode to their attachment mode through their exchange mode, i.e., during the exchange work performed between the standby mode and the attachment mode, the probes P1 and P2 can be rearranged in a short time and smoothly without disturbing the probes P1 and P2.

The configuration of the loading platforms 11-1 and 11-2 is described in further detail below by referring to FIGS. 4-6. Where it is not necessary to discriminate between the loading platforms 11-1 and 11-2, each of these loading platforms may be referred to as the loading platform 11.

Figure 4:
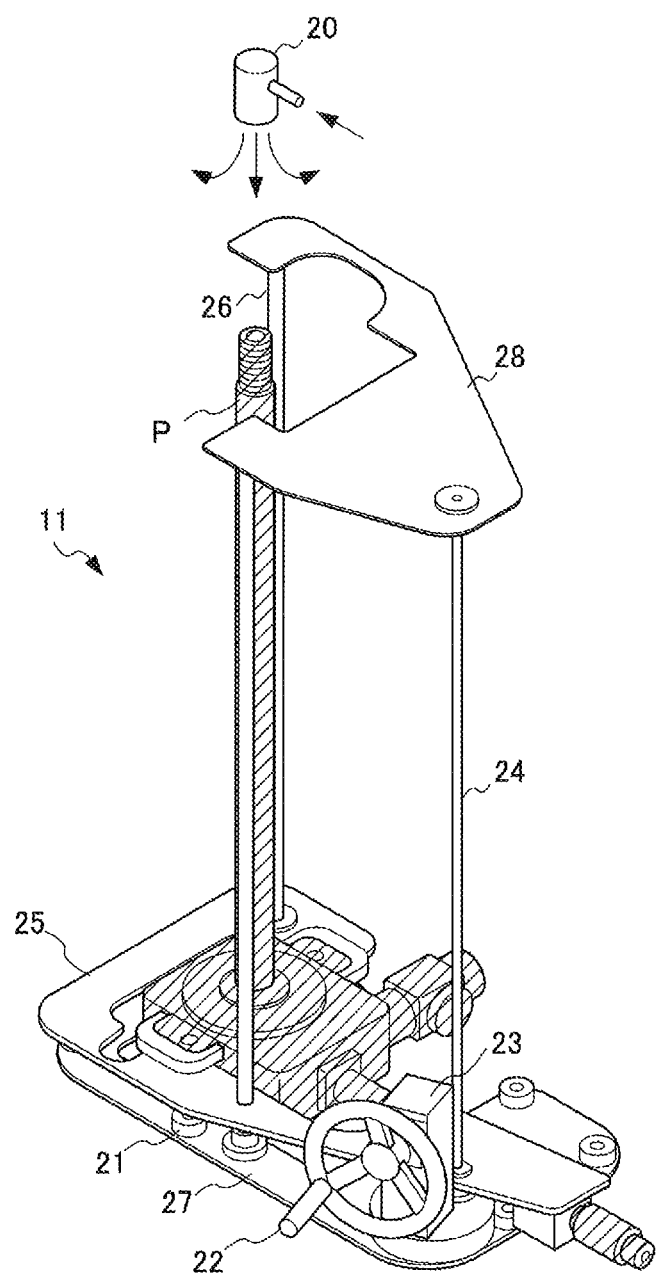
FIG. 4 is a perspective view of a loading platform of the probe attaching and detaching device shown in FIG. 1, and in which a cryogenic probe is loaded in the loading platform.

FIG. 4 is a perspective view of the loading platform 11, and in which one cryogenic probe P is loaded in the platform. The loading platform 11 has ball casters 21, a rotatable handle 22, a transfer mechanism 23, a ball screw 24, a stage 25, pillar shafts 26, a pedestal 27, and a pillar plate 28.

The ball casters 21 are mounted at the bottom of the pedestal 27 (described later) and constitute a horizontal drive mechanism capable of freely moving the platform 11 on the floor G substantially horizontally as shown in FIG. 1. The horizontal drive mechanism is not restricted to the ball casters 21 but the ball casters 21 are preferably used as the horizontal drive mechanism because they allow for horizontal motion without giving vibrations of magnitude affecting the cryogenic probe P.

The handle 22 is a manipulation tool permitting a user to impart a rotary motion in order to elevate or lower the stage 25 (described later) carrying the probe P thereon. The transfer mechanism 23 has gears (not shown) and transmits power generated by rotary motion of the handle 22 to the ball screw 24 at an appropriate gear ratio.

The ball screw 24 has a threaded shaft mounted between the pedestal 27 (described later) and the pillar plate 28. Furthermore, the ball screw 24 has a nut mounted to the stage 25. The ball screw 24 converts the rotary motion transmitted from the handle 22 via the transfer mechanism 23 into a linear motion to thereby elevate or lower the stage 25 along the threaded shaft.

In the present embodiment, the handle 22 acts as a power source for imparting a rotative power to the transfer mechanism 23. The power source is not restricted to this handle. Any arbitrary manipulation tool for manually producing a rotative power may also be used. Furthermore, an electric motor producing a rotative power by electricity may also be employed. A motor producing a rotative power using a pneumatic machine may also be utilized. In this way, any arbitrary device automatically producing a rotative power may be adopted.

That is, the handle 22, transfer mechanism 23, and ball screw 24 together constitute a vertical drive mechanism for elevating or lowering the stage 25 (described later) carrying the cryogenic probe P thereon. In the present embodiment, the vertical drive mechanism is composed of a gear transmission designed taking account of a gear ratio. Although the vertical drive mechanism is not restricted to a gear transmission, a gear transmission is preferably used as the vertical drive mechanism because it can elevate or lower the cryogenic probe P with a smaller force than the load of the probe P and the load of the transfer tube 12-1 or 12-2 (FIG. 1) without imparting great vibrations which damage the probe P.

The stage 25 is placed by the threaded shaft of the ball screw 24 and the two pillar shafts 26 such that the stage 25 can move up and down between the pedestal 27 (described later) and the pillar plate 28. The cryogenic probe P is carried on the top surface of the stage 25 shown in FIG. 4.

The pillar shafts 26 cooperate with the threaded shaft of the ball screw 24 to place the stage 25 such that the stage 25 can move up or down between the pedestal 27 (described later) and the pillar plate 28.

The pedestal 27 is a base disposed opposite to the floor G (FIG. 1), and has a bottom surface on which the ball casters 21 are mounted. The transfer mechanism 23, one end of the threaded shaft of the ball screw 24, and respective one ends of the two pillar shafts 26 are mounted on the top surface of the pedestal 27 shown in FIG. 4.

The other end of the threaded shaft of the ball screw 24 and respective other ends of the two pillar shafts 26 are mounted to the pillar plate 28. Thus, the pillar plate 28 holds the ball screws 24 and the two pillar shafts 26 in a substantially vertical direction.

Figure 5:
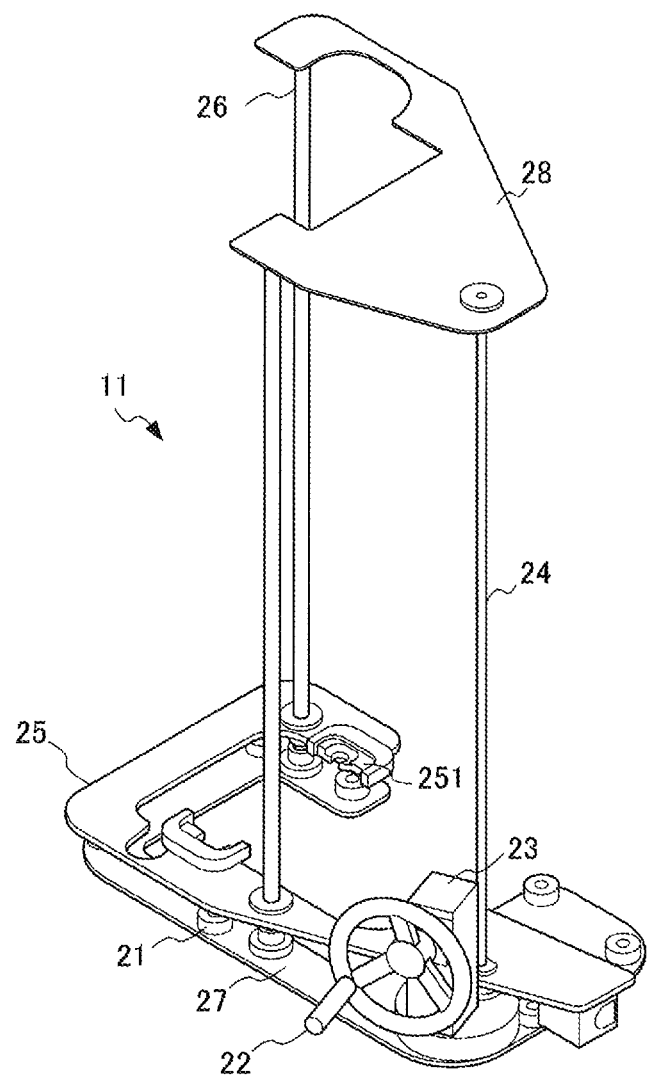
FIGS. 5 and 6 are perspective views similar to FIG. 4, but in which a cryogenic probe is not yet loaded in the loading platform.
Figure 6:
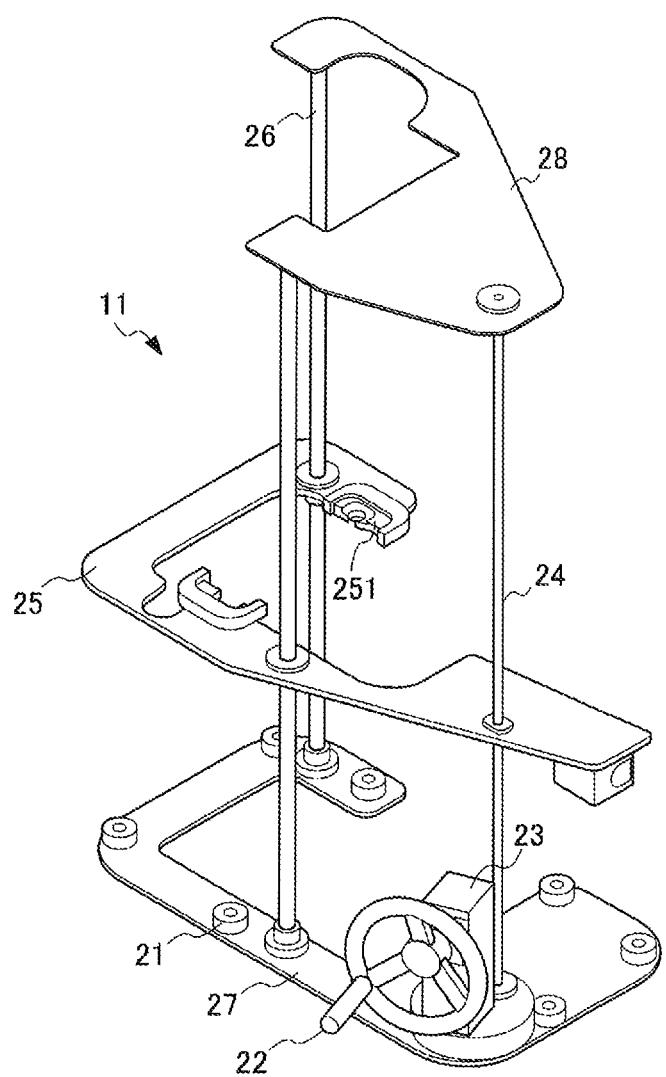

FIGS. 5 and 6 are perspective views of the loading platform 11, showing the condition in which the cryogenic probe P is not yet loaded. In the state of FIG. 5, the stage 25 is in its lowest position. In the state of FIG. 6, the stage 25 has moved upward from the lowest position into a position midway between the pedestal 27 and the pillar plate 28.

As shown in FIGS. 5 and 6, a probe support base 251 on which the cryogenic probe P is non-fixedly loaded is formed on the top surface of the stage 25 shown in FIGS. 5 and 6. If the state of the probe P shifts from the standby mode to the exchange mode, the ball casters 21 permit the loading platform 11 to horizontally move from the standby position into the exchange position while the probe P remains loaded on the probe support base 251 (see FIG. 4) without being securely fixed.

Then, the handle 22 is rotated by the user. The stage 25 moves upward from the state shown in FIG. 5 into its uppermost position (not shown) through the state shown in FIG. 6 while the cryogenic probe P remains non-fixedly loaded on the probe support base 251.

At this time, the cryogenic probe P is in the bore M1 of the superconductive magnet unit M after being upwardly inserted from the lower opening of the hole M. The probe is securely fixed to the magnet unit M with screws or the like.

Then, the user rotates the handle 22 in reverse. As a result, only the stage 25 moves downward into its lowest position shown in FIG. 5 through the state shown in FIG. 6.

In this way, after the cryogenic probe P has been placed in the attachment mode, the probe support base 251 of the stage 25 operates as a mechanism for lowering the stage 25 away from the probe P. This mechanism for spacing the stage 25 away from the probe may be hereinafter referred to as the spacing mechanism. This spacing mechanism prevents the cryogenic probe P and the superconductive magnet unit M from making mechanical contact with the loading platform 11. Hence, external vibrations from the loading platform 11 are not transmitted.

Referring back to FIG. 1, the transfer tubes 12-1 and 12-2 connect the probe cooling device 14 (described later) with the movable cryogenic probes P1 and P2, respectively. As described previously, when the cryogenic probe P is in the standby mode, exchange mode, or attachment mode, the probe P assumes a different position, i.e., standby position, exchange position, or attachment position, respectively. On the other hand, the probe cooling device 14 (described later) is held at an appropriate position. Accordingly, the transfer tubes 12-1 and 12-2 are made of a flexible material to permit bending deformation of the tubes 12-1 and 12-2 according to varying arrangement of the probes P1 and P2.

The transfer tubes 12-1 and 12-2 include the refrigerant supply lines L11 (cooling tubes), respectively, for transporting the outward streams of refrigerant 81 and refrigerant discharge lines L12 (outer tubes), respectively, for transporting the returning streams of refrigerant 82, respectively. As shown in FIG. 2, there is a probe coupler 121 for connection with the transfer tubes 12-1 and 12-2.

A space defined by a spacer as made of a thermal insulator is present between the refrigerant supply lines L11 and the refrigerant discharge lines L12 and maintained at vacuum. Therefore, the tolerable bending deformation of the transfer tubes 12-1 and 12-2 is defined by a maximum bending radius at which the refrigerant supply/discharge lines L11 and L12 do not make thermal contact with each other. In this case, the bending radii of the transfer tubes 12-1 and 12-2 need to lie within the tolerable range irrespective of the position of the cryogenic probe P1 or P2, i.e., whether in the standby position, exchange position, or attachment position.

The support bases 13-1 and 13-2 are members for supporting the transfer tubes 12-1 and 12-2, respectively. In particular, to eliminate the effects of the magnetic field leaking from the superconductive magnet unit M, the probe cooling device 14 (described later) needs to be held at a position remote from the superconductive magnet unit M and from the position of the cryogenic probe P assumed in the attachment mode. As a result, the transfer tubes 12-1 and 12-2 are lengthened and provide greater loads. Accordingly, the support bases 13-1 and 13-2 are disposed at positions other than all of the ends of the transfer tubes 12-1, 12-2, the exit of the probe cooling device 14 (in the vicinity of the probe coupler 121 shown in FIG. 2), and the entrance of the cryogenic probe P and act as fixed points.

During the process where the cryogenic probe P goes from its standby mode to its attachment mode through the exchange mode, those portions of the transfer tubes 12-1 and 12-2 to which bending deformation is subjected are between the support base 13-1 and the probe P1 and between the support base 13-2 and the probe P2, respectively. The heights and installation positions of the support bases 13-1 and 13-2 are adjusted such that the bending radii in these portions do not exceed the tolerable range.

The probe cooling device 14 operates to transport a refrigerant to the cryogenic probes P1 and P2 via the transfer tubes 12-1 and 12-2, respectively. The probe cooling device 14 of the present embodiment has a probe cooling compressor 31, a cold head 32, a cold head cooling compressor 33, open-close valves 34-1, 34-2, and open-close valves 35-1, 35-2.

The probe cooling compressor 31 produces a differential pressure for transporting the outward streams of refrigerant 81 from the probe cooling device 14 into the cryogenic probe P or transporting the returning streams of refrigerant 82 from the cryogenic probe P into the probe cooling device 14. The cold head 32 is a small-sized cryogenic refrigerator that cools the returning streams of refrigerant 82 and delivers cooled outward streams of refrigerant 81. The outward streams of refrigerant 81 pass through the refrigerant supply lines L11 and are supplied as a refrigerant into the cryogenic probes P1 and P2 via the transfer tubes 12-1 and 12-2, respectively.

The cold head cooling compressor 33 is used to cool the cold head 32, and is mounted independent of the probe cooling compressor 31. The open-close valve 34-1 opens and closes the refrigerant discharge line L12 for the cryogenic probe P1. The open-close valve 34-2 opens and closes the refrigerant discharge line L12 for the cryogenic probe P2. The open-close valve 35-1 opens and closes the refrigerant supply line L11 for the cryogenic probe P1. The open-close valve 35-2 opens and closes the refrigerant supply line L11 for the cryogenic probe P2.

In this way, the power for transporting the refrigerant (including the outward streams 81 and returning streams 82) to and from the probe cooling device 14 is the differential pressure produced by the probe cooling compressor 31, the differential pressure being relative to the pressure of the solvent in the piping of a probe detection portion. As described previously, when the cryogenic probe P is in the standby mode, exchange mode, or attachment mode, the probe P assumes the standby position, exchange position, or attachment position, respectively. Therefore, the transfer tubes 12-1 and 12-2 undergo bending deformation according to variation of the arrangement of the cryogenic probes P1 and P2. For this reason, when the differential pressure relative to atmospheric pressure is large, if the refrigerant supply lines L11 (cooling tubes) that transport high-pressure gas are bent, a danger may be incurred in handling the high-pressure gas. Accordingly, it is desired to reduce the differential pressure as much as possible.

Therefore, it is not appropriate to apply the technique as set forth in U.S. Pat. No. 7,222,490 to the probe cooling device 14. The technique of U.S. Pat. No. 7,222,490 is to branch a compression line used for the refrigeration cycle of a refrigerator into lines circulating around the probe. Usually, gas pressure in a compressor used for heat cycles of compression-adiabatic expansion (cooling cycle of a refrigerator) is high and so the differential pressure is also great. Consequently, it is not appropriate to apply the technique of U.S. Pat. No. 7,222,490 to the probe cooling device 14.

In other words, in the probe cooling device 14 of the present embodiment, the route of the probe cooling pipe line extending from the refrigerant discharge lines L12 (outer tube) to the refrigerant supply lines L11 (cooling tube) via the probe cooling compressor 31 is formed apart from the cycling system of the refrigeration cycle of the refrigerator including the cold head cooling compressor 33 for cooling the cold head 32. This permits the differential pressure in the route of the probe cooling pipe line can be set sufficiently low that safety is assured.

The vacuum pumping system 15 is connected with the cryogenic probes P1 and P2 via the open-close valves 16-1 and 16-2, respectively, by vacuum pipes 17-1 and 17-2, respectively, and evacuates the interiors of the probes P1 and P2. The open-close valve 16-1 opens and closes the vacuum pipe 17-1 for the cryogenic probe P1. The open-close valve 16-2 opens and closes the vacuum pipe 17-2 for the cryogenic probe P2.

The vacuum pipes 17-1 and 17-2 connect the vacuum pumping system 15 fixedly mounted at an appropriate location with the movable cryogenic probes P1 and P2, respectively. As described previously, when the cryogenic probe P is in the standby mode, exchange mode, or attachment mode, the probe P assumes the standby position, exchange position, or attachment position, respectively. On the other hand, the vacuum pumping system 15 is held at an appropriate position. Accordingly, the vacuum pipes 17-1 and 17-2 are made of a flexible material to permit bending deformation of the cryogenic probes P1 and P2 according to varying arrangement of the probe P1 or P2.

The tolerable bending deformation is defined by the repetitive bending radius within the range of use where damage does not occur. In this case, the bending radii of the transfer tubes 12-1 and 12-2 need to lie within the above-described tolerable range irrespective of whether the cryogenic probe P2 is in the standby position, exchange position, or attachment position.

The temperature-controlled gas feeder 18 supplies a temperature-controlled gas into the shielding pipe 54 (FIG. 2) for the cryogenic probes P1 and P2 via the open-close valves 19-1 and 19-2, respectively. The temperature-controlled gas feeder caps 20-1 and 20-2 are fitted over the probes P1 and P2, respectively.

The open-close valve 19-1 opens and closes the pipe, which is connected with the temperature-controlled gas feeder cap 20-1, for the cryogenic probe P1. The open-close valve 19-2 opens and closes the pipe, which is connected with the temperature-controlled gas feeder cap 20-2, for the cryogenic probe P2.

The temperature-controlled gas feeder caps 20-1 and 20-2 are fitted over the upper side or lower side of the shielding pipe 54 (FIG. 2) for the cryogenic probes P1 and P2. When the cryogenic probes P1 and P2 are in their standby mode, it is anticipated that the temperature-controlled gas will not flow well because the probes P1 and P2 are close to the floor G as shown in FIG. 1. Therefore, in the standby mode, the caps 20-1 and 20-2 are fitted over the upper side of the shielding pipe 54. As a result, the temperature-controlled gas from the temperature-controlled gas feeder 18 flows through the shielding pipe 54 from top down.

On the other hand, in the exchange mode or in the attachment mode, the temperature-controlled gas feeder caps 20-1 and 20-2 are fitted over the lower side of the shielding pipe 54. As a result, the temperature-controlled gas from the temperature-controlled gas feeder 18 flows through the shielding pipe 54 from bottom to top.

While one preferred embodiment of the present invention has been described so far, the invention is not restricted to this embodiment. Rather, the invention can be implemented in various forms.

For instance, the probe cooling device 14 shown in FIG. 2 is adopted in the above embodiment. The invention is not restricted to this usage. Any arbitrary device capable of transporting a refrigerant into the cryogenic probes P (the two cryogenic probes P1 and P2 in the above embodiment) contained in the NMR spectrometer can be employed.

Figure 7:
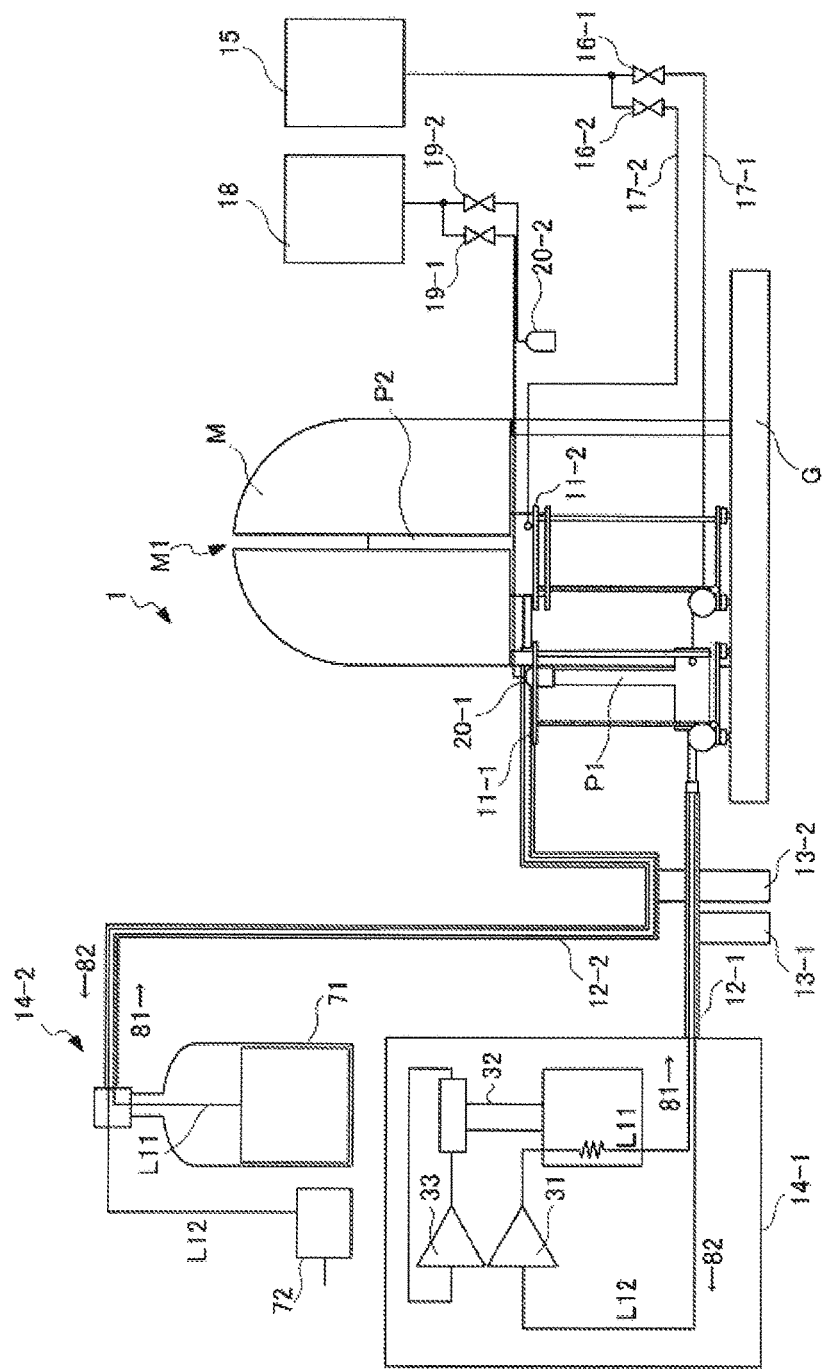
FIG. 7 is a side elevation similar to FIG. 1, but showing an NMR spectrometer which includes a probe attaching and detaching device associated with the present invention and which uses a probe cooling device different from the probe cooling device shown in FIG. 1.

FIG. 7 shows the whole configuration of an NMR spectrometer which includes the cryogenic probe attaching and detaching device associated with the present invention and uses probe cooling devices different from the probe cooling device shown in FIG. 1. The NMR spectrometer 1 of FIG. 7 has a probe cooling device 14-1 for cooling the cryogenic probe P1 and a probe cooling device 14-2 for cooling the cryogenic probe P2. In other respects, the NMR spectrometer 1 of FIG. 7 is similar to the NMR spectrometer 1 of FIG. 1. Accordingly, a description of these similarities is omitted.

The probe cooling device 14-1 is fundamentally similar in function and configuration to the probe cooling device 14 shown in FIG. 1 and thus has the probe cooling compressor 31, cold head 32, and cold head cooling compressor 33 in the same way as the device of FIG. 1. The compressor 31, cold head 32, and compressor 33 have been already described in connection with FIG. 1.

The probe cooling device 14 of FIG. 1 has two routes for transporting a refrigerant to the two cryogenic probes P1 and P2 and so the open-close valves 34-1, 34-2, 35-1, 35-2 are used to switch the operative route of transportation. On the other hand, the probe cooling device 14-1 of FIG. 7 needs to transport a refrigerant only to the single cryogenic probe P1. That is, there is only one pathway. Consequently, the open-close valves 34-1, 34-2, 35-1, and 35-2 are omitted.

The probe cooling device 14-2 has a refrigerant container 71 and a pump 72. The refrigerant container 71 is a receptacle for storing a refrigerant (liquid nitrogen in the present embodiment) to be supplied in the cryogenic probe P2. The upstream end of a refrigerant supply line L11 stored within the transfer tube 12-2 is connected with the refrigerant container 71. In the container 71, the upstream end of the refrigerant supply line L11 is open in the neighborhood of the bottom. The container 71 has a refill port (not shown) through which the outward stream of refrigerant 81 can be resupplied. This refrigerant container 71 can be replaced with another refrigerant container 71 by removing a connector (not shown) mounted at the upstream end of the refrigerant supply line L11.

The pump 72 depressurizes a refrigerant discharge line L12 (and line L22 of FIG. 2) to draw the outward stream of refrigerant 81 from the refrigerant container 71 into the heat exchanger 533 of the cryogenic probe P2. For example, the pump 72 is a diaphragm pump. The downstream end of the refrigerant discharge line L12 stored within the transfer tube 12-2 is connected with the pump 72.

In this way, the power for transporting the refrigerant in the probe cooling device 14-2 (including the outward stream of refrigerant 81 and returning stream of refrigerant 82) is the differential pressure produced by the pump 72 relative to the pressure of solvent in the pipe of the probe detection portion, in the same way as the probe cooling device 14 (and the probe cooling device 14 of FIG. 7) of FIG. 1.

Accordingly, as described previously, the transfer tube 12-2 undergoes bending deformation according to variation of the arrangement of the cryogenic probe P2. Therefore, where the differential pressure relative to atmospheric pressure is great, bending the refrigerant supply line L11 (cooling tube) for transporting high-pressure gas may entail danger because the high-pressure gas is treated. Thus, it is desired to reduce the differential pressure as much as possible.

The number of the cryogenic probes P is two in the above embodiment. The number is not restricted to two. The number may be one or three or more. Where high-sensitivity measurements or high measurement throughput is taken into account, it is preferable to use plural cryogenic probes rather than a single cryogenic probe.

Let N be the number of the cryogenic probes P (where N is any arbitrary integer equal to or greater than 2). The N cryogenic probes P are referred to as cryogenic probes P1 to PN, respectively. Loading platforms 11-1 to 11-N, transfer tubes 12-1 to 12-N, support bases 13-1 to 13-N, open-close valves 16-1 to 16-N, vacuum pipes 17-1 to 17-N, open-close valves 19-1 to 19-N, and temperature-controlled gas feeder caps 20-1 to 20-N are provided for the cryogenic probes P1 to PN, respectively, unlike the configuration of FIG. 1, in an unillustrated manner. For the probe cooling device, it is only necessary to provide N supply lines for refrigerant passing through the transfer tubes 12-1 to 12-N, respectively. Only one probe cooling device may be provided as shown in FIG. 1. Plural probe cooling devices may be provided as shown in FIG. 7.

In the above embodiment, the loading platform 11-1 carries the single cryogenic probe P-1 therein. The loading platform 11-2 carries the single cryogenic probe P-2 therein. The loading platforms 11-1 and 11-2 are mounted independent of each other. The present invention is not restricted to this configuration. For example, a single common loading platform in which the cryogenic probes P-1 and P-2 are loaded at different locations may be used.

As described previously, the number of the cryogenic probes P is not restricted to two but may be N. Therefore, the number of cryogenic probes P that can be loaded in the common loading platform can be set to K, where K is any arbitrary integer between 2 and N, inclusively.

This common loading platform carries the K cryogenic probes P1 to PK therein. The horizontal drive mechanism is so configured as to move the platform such that the probes are selectively placed in the insertion position, one probe at a time, and that the other probes are placed in their standby positions. The vertical drive mechanism is configured to be able to move the probes separately in a vertical direction. The spacing mechanism is configured to be able to space the loading platform away from the plural probes such that this spacing operation is performed independently and separately for each of the probes. Motion made by the horizontal drive mechanism can be linear motion, rotation, or other kind of motion according to the shape of the common loading platform and the arrangement of the plural probes.

In the above embodiment, what are replaced with each other in the superconductive magnet unit M are the cryogenic probes P-1 and P-2. The invention is not restricted to this scheme. The subjects of replacement may be a cryogenic probe P and an ordinary probe not cooled.

In this case, no restriction is imposed on the method of attaching and detaching normal probes to and from the superconductive magnet unit M. A tool separate from the probe attaching and detaching device may be used to attach and detach probes. Alternatively, normal probes may be loaded in the loading platform 11-1 or 11-2 of the probe attaching and detaching device or in a common loading platform and unloaded in the same way as the cryogenic probes P. That is, the loading platforms 11-1 and 11-2 can carry normal probes not having cooling means instead of the cryogenic probes P.

In other words, the probe attaching and detaching device embodying the present invention only needs to be designed as follows and can assume various forms and embodiments. The probe attaching and detaching device according to the present invention is adapted to attach and detach a cryogenic probe to and from an NMR spectrometer and has a loading platform, a probe cooling device, transfer tubes, a temperature-controlled gas feeder, a vacuum pumping system, and vacuum pipes. The cryogenic probe (such as the cryogenic probe P of FIG. 2) has a detection module (such as the detection coil 51 and preamplifier 52 of FIG. 2) for detecting an electrical signal induced by nuclear magnetic resonance of a sample, a cooling portion (such as the cooling portion 53 of FIG. 2) for cooling the detection module by means of a refrigerant, and a shielding pipe (such as the shielding pipe 54 of FIG. 2) for isolating a vacuum space where the detection module and the cooling portion are disposed from a space at atmospheric pressure where the sample is disposed.

The loading platform (such as the loading platforms 11-1 and 11-2 of FIG. 1) has a horizontal drive mechanism (such as the ball casters 21 of FIG. 4) carrying a cryogenic probe thereon and moving in a horizontal direction, a vertical drive mechanism (such as a mechanism including the handle 22, transfer mechanism 23, and ball screw 24 of FIG. 4) for moving the cryogenic probe in a vertical direction, and a spacing mechanism (such as the probe support base 251 of the stage 25 of FIGS. 5 and 6) for spacing the loading platform away from the cryogenic probe when the probe is installed in an NMR spectrometer.

The probe cooling device (such as the probe cooling device 14 of FIG. 1 or the probe cooling devices 14-1 and 14-2 of FIG. 7) cools the cryogenic probe by circulating a refrigerant to and from the cryogenic probe. The transfer tubes (such as the transfer tubes 12-1 and 12-2 of FIG. 1) are made of a flexible material and include refrigerant supply lines (such as the refrigerant supply lines L11 of FIG. 1) for supplying the refrigerant from the probe cooling device to the cryogenic probe and refrigerant discharge lines (such as the refrigerant discharge lines L12 of FIG. 1) for causing the refrigerant discharged from the cryogenic probe to return to the probe cooling device.

The temperature-controlled gas feeder (such as the temperature-controlled gas feeder 18 of FIG. 1) supplies a temperature-controlled gas to the shielding pipe. The vacuum pumping system (such as the vacuum pumping system 15 of FIG. 1) evacuates the interior of the cryogenic probe. The vacuum pipes (such as the vacuum pipes 17-1 and 17-2 of FIG. 1) are made of a flexible material and connect together the vacuum pumping system and the cryogenic probe.

The cryogenic probe can be easily attached and detached by utilizing the probe attaching and detaching device according to the present invention. Furthermore, the inventive device for attaching and detaching a cryogenic probe has a loading platform, a probe cooling device, transfer tubes, a vacuum pumping system, and vacuum pipes. Consequently, evacuated and cooled conditions can be achieved irrespective of whether the cryogenic probe is in its standby mode, exchange mode, or attachment mode. An optimum cryogenic probe is selected from among plural probes according to the properties of the sample and information to be obtained and is attached. Then, a measurement can be commenced immediately. As a result, high-sensitivity measurements can be achieved. Also, high measurement throughput can be provided.

In order that each of plural cryogenic probes operate as an NMR apparatus component immediately after replacement and attachment of the probe and an NMR signal be detected, the probe must satisfy the evacuated and cooled requirements when the probe is in its exchange mode or standby mode. It is also important to maintain the interior of the shielding pipe (such as the shielding pipe 54 of FIG. 2) at a desired temperature (normally, room temperature), the pipe partitioning the interior of the sample space in the cryogenic probe, i.e., isolating the interior of the vacuum space of the probe where the detection module and the cooling portion are disposed from the sample space at atmospheric pressure.

Specifically, a gap (vacuum space) is formed between the shielding pipe and the surrounding detection coil at a lower temperature. Transfer of heat via gas can be avoided by the adiabatic effects of the vacuum space. However, heat transfer due to heat radiation will lower the temperatures of the shielding pipe itself and of the sample placed in the sample space within the pipe. This creates the possibility that the cryogenic probe will be damaged by dew condensation or frosting or the sample will be damaged by freezing of the sample.

In the inventive device for attaching and detaching a probe, a temperature-controlled gas is supplied by a temperature-controlled gas feeder and flows through the interior of the shielding pipe that is a sample space. Therefore, the heat budget of the sample space is balanced and the space is maintained at room temperature. Consequently, damage to the sample and cryogenic probe can be prevented.

As described so far, the inventive device for attaching and detaching a probe permits an optimum probe to be replaced in a short time according to properties of a sample and information to be derived and made usable. This allows for high-sensitivity measurements and high measurement throughput.

The device for attaching and detaching a probe can have plural loading platforms, plural transfer tubes, and plural vacuum pipes corresponding to plural cryogenic probes to carry these cryogenic probes at the same time.

The following operation can be implemented by loading plural cryogenic probes at the same time and sharing one superconductive magnet for the probes. A desired probe is selected from plural cryogenic probes which are made to satisfy the evacuated and cooled conditions at all times regardless of whether the probes are in their standby mode, exchange mode, or attachment mode according to properties of a sample and information to be derived. The selected probe is loaded into the superconductive magnet of the NMR spectrometer. A measurement of the sample is immediately started. Thus, high-sensitivity measurements and high measurement throughput can be achieved with better results.

Having thus described our invention with the detail and particularity required by the Patent Laws, what is desired protected by Letters Patent is set forth in the following claims.

The invention claimed is:

1. A device for attaching and detaching at least one probe to and from a probe insertion portion of a nuclear magnetic resonance (NMR) spectrometer, the probe having a detection module for detecting an electrical signal induced by nuclear magnetic resonance of a sample and a cooling portion for cooling the detection module by a refrigerant, said device comprising:

at least one loading platform for carrying the probe therein, the loading platform having a horizontal drive mechanism for moving the carried probe in a horizontal direction to bring the probe into an exchange position located opposite to the probe insertion portion and into a standby position remote from the probe insertion portion, a vertical drive mechanism for moving the probe in a vertical direction, and a spacing mechanism for spacing the loading platform away from the probe when the probe is loaded in the NMR spectrometer;

a probe cooling device for cooling the probe by supplying the refrigerant into the cooling portion of the probe;

transfer tubes made of a flexible material and each including a refrigerant supply line for supplying the refrigerant from the probe cooling device into the probe and a refrigerant discharge line for causing the refrigerant discharged from the probe to be returned to the probe cooling device;

a vacuum pumping system for evacuating the interior of the probe; and vacuum pipes made of a flexible material and connecting together the vacuum pumping system and the probes.

2. The device for attaching and detaching at least one probe as set forth in claim 1, wherein said at least one probe and said at least one loading platform are plural in number, and wherein the plural loading platforms, the plural transfer tubes, and the plural vacuum pipes are provided for the plural probes to load the probes at the same time.

3. The device for attaching and detaching at least one probe as set forth in claim 2, wherein said probe has a shielding pipe for thermally insulating said detection module, said cooling portion, and said sample, and wherein there is further provided a temperature-controlled gas feeder for supplying a gas to the shielding pipe for temperature adjustment.

4. The device for attaching and detaching at least one probe as set forth in claim 3, wherein there is further provided a support base which is disposed between said probe cooling device and said probe and which provides support of said transfer tubes.

5. The device for attaching and detaching at least one probe as set forth in claim 4, wherein said flexible material of said transfer tubes has a maximum bending radius within a range in which said refrigerant supply line and said refrigerant discharge line are not in thermal contact with each other.

6. The device for attaching and detaching at least one probe as set forth in claim 1,
- wherein said at least one loading platform is single in number, said at least one probe is plural in number, and the plural probes are loaded at different positions in the single loading platform;
- wherein said horizontal drive mechanism moves the loading platform such that the plural probes are selectively placed in said insertion position, one probe at a time, and other probes are placed in their standby positions;
- wherein said vertical drive mechanism can move the plural probes separately in a vertical direction; and
- wherein said spacing mechanism can space said loading platform away from said plural probes such that this spacing operation is performed independently and separately for each of the probes.

* * * * *